United States Patent [19]
Goodwin

[11] Patent Number: 6,067,649
[45] Date of Patent: May 23, 2000

[54] METHOD AND APPARATUS FOR A LOW POWER SELF TEST OF A MEMORY SUBSYSTEM

[75] Inventor: Paul Marshall Goodwin, Littleton, Mass.

[73] Assignee: Compaq Computer Corporation, Houston, Tex.

[21] Appl. No.: 09/095,435

[22] Filed: Jun. 10, 1998

[51] Int. Cl.[7] .............................. G11C 29/00; G01R 31/28
[52] U.S. Cl. .................... 714/718; 714/733; 365/189.01; 365/194; 365/201; 365/233
[58] Field of Search .................................... 714/718, 723, 714/726, 733, 736; 365/189.01, 189.04, 189.05, 189.12, 194, 201, 220, 221, 222, 233, 240

[56] References Cited

U.S. PATENT DOCUMENTS

| | | | |
|---|---|---|---|
| 5,216,672 | 6/1993 | Tatosian et al. | 714/718 |
| 5,402,389 | 3/1995 | Flannagan et al. | 365/233 |
| 5,539,692 | 7/1996 | Kajigaya et al. | 365/189.01 |
| 5,553,082 | 9/1996 | Connor et al. | 714/733 |
| 5,587,950 | 12/1996 | Sawada et al. | 365/201 |
| 5,995,424 | 11/1999 | Lawrence et al. | 365/201 |

OTHER PUBLICATIONS

Product Specification: KM48S8030/KM48S8031, Target/CMOS SDRAM, 8M×8 BIT Synchronous Dynamic RAM, Rev. 0, Samsung Electronics.

Primary Examiner—Emmanuel L. Moise
Attorney, Agent, or Firm—Hamilton, Brook, Smith & Reynolds, P.C.

[57] ABSTRACT

A technique self tests a memory system having memory modules that operate at a normal operating clock rate during a normal operating mode. Each memory module has multiple arrays of synchronous dynamic random access memory devices. The technique involves obtaining, independently of a central controller, time phase identifiers that respectively correspond to the memory modules, and reducing the normal operating clock rate to a reduced clock rate. The technique further involves executing, in the memory modules, self test transactions in different time phases depending on the obtained time phase identifiers. The memory modules initiate execution of self test transactions at the reduced clock rate. Multiple memory modules execute self test transactions in each of the different time phases. Each memory module executes self test transactions that alternately access the multiple arrays of that memory module. Preferably, the time phase identifiers are based on module identifiers that uniquely identify the memory modules.

20 Claims, 7 Drawing Sheets

METHOD AND APPARATUS FOR A LOW POWER SELF TEST OF A MEMORY SUBSYSTEM

BACKGROUND OF THE INVENTION

Computer systems typically include one or more data processing devices (processors) and a main memory system having one or more memory devices (memory modules). Such computer systems often perform self test procedures that determine whether the processors and memory devices are operating properly.

In one type of computer system, a processor initially performs a self test of its own internal components. If the processor passes the self test, the processor tests the memory system. In particular, the processor writes data to and reads data from the memory modules within the memory system to verify that the memory modules can store and provide data correctly. Typically, this processor-performed read/write procedure tests the memory modules in a serial manner. If the memory system passes the test, the computer system enters a normal operating mode.

In another type of computer system, a processor performs a self test of its internal components, and subsequently instructs the memory modules to execute internal self tests, and those self tests are conducted in parallel. Each memory module of the memory system responds by simultaneously running an individual self test utilizing internal error detecting and correcting circuitry (EDC). In this parallel self test procedure, the processor considers the memory system operational if each memory module passes its respective self test. If the processor determines that the memory system is operational, the computer system enters its normal operating mode. A conventional computer system that performs a parallel self test procedure that is similar to that described above is disclosed in U.S. Pat. No. 5,216,672, the entire teachings of which are hereby incorporated by reference.

The parallel self test procedure requires less time to complete than the processor-performed read/write procedure. In particular, the time required to test memory modules using the parallel self test procedure is the time required for one memory module to perform its self test since the memory modules operate in parallel. In contrast, the time required to test memory modules using the processor-performed read/write procedure is the total time required to serially test the memory modules. Furthermore, the internal bandwidth of a memory module is generally greater than the bandwidth of an interconnect between a processor and a memory system. Accordingly, it typically takes less time for a memory module to perform a self test internally than for a processor to test a memory module by performing read/write transactions through the interconnect.

SUMMARY OF THE INVENTION

Self tests typically are performed when a computer system is powered-up or reset. Computer systems using either the processor-performed read/write procedure or the parallel self test procedure require that the processor complete its self test prior to initiating memory module self tests. Accordingly, a substantial amount of time may pass before the computer system becomes operational in a normal operating mode.

Furthermore, it is not always practical to implement the parallel self test procedure in a computer system due to power constraints. That is, when a memory module performs a self test transaction (a read or write transaction to one or more memory locations), the memory module consumes power. When several modules perform internal self tests at internal memory module bandwidth, the amount of power consumed can be substantial compared to that consumed during normal operating mode. As such, the power supplies of some computer systems may not be capable of providing enough power to support all memory modules simultaneously running individual self tests.

In contrast, the present invention is directed to a technique for self testing a memory system, where less than all of the memory modules execute self test transactions at the same time. The technique involves obtaining time phase identifiers that respectively correspond to the memory modules, and executing, in the memory modules, self test transactions in different time phases depending on the obtained time phase identifiers. Preferably, initiation of self test transactions in the memory modules is synchronous with a clock signal having a clock rate that is reduced from a normal operating clock rate (the internal bandwidth) of the memory modules during a normal operating mode. Since less than all of the memory modules execute self test transactions at the same time, and since initiation of self test transactions is synchronous with a reduced clock rate, power supply limits are not exceeded. Furthermore, each memory module uses internal circuitry to execute self test transactions such that testing may be at the memory module bandwidth rather than the slower bandwidth of the interconnect between the processor and the memory system. Accordingly, the startup time is reduced.

The memory modules preferably acquire the time phase identifiers independently of a central controller (e.g., a processor) that is capable of accessing each of the memory modules during a normal operating mode. Accordingly, the memory modules can initiate self test transactions before the central controller completes its self test, and thereby further reduce the startup time needed to become operational in a normal operating mode.

The time phase identifiers preferably are based on module identifiers that uniquely identify the memory modules. In particular, the time phase identifier corresponding to each memory module may include a bit field of the module identifier that uniquely identifies that module. Each module may then compare its time phase identifier (the bit field of its module identifier) to a signal, and initiate a self test transaction in that module when the time phase identifier matches the signal.

Furthermore, multiple memory modules may execute self test transactions in each of the different time phases. Accordingly, some but not all of the memory modules perform self test transactions at the same time. In one configuration, the memory system includes four memory modules, and two of the four memory modules execute self test transactions in each of alternate time phases. Execution of at least some self test transactions in parallel further reduces startup time.

Additionally, each memory module preferably includes multiple memory arrays. As such, each memory module may execute self test transactions that alternately access the multiple arrays of that memory module. This enables each memory module to precharge one array while testing another array.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 1:
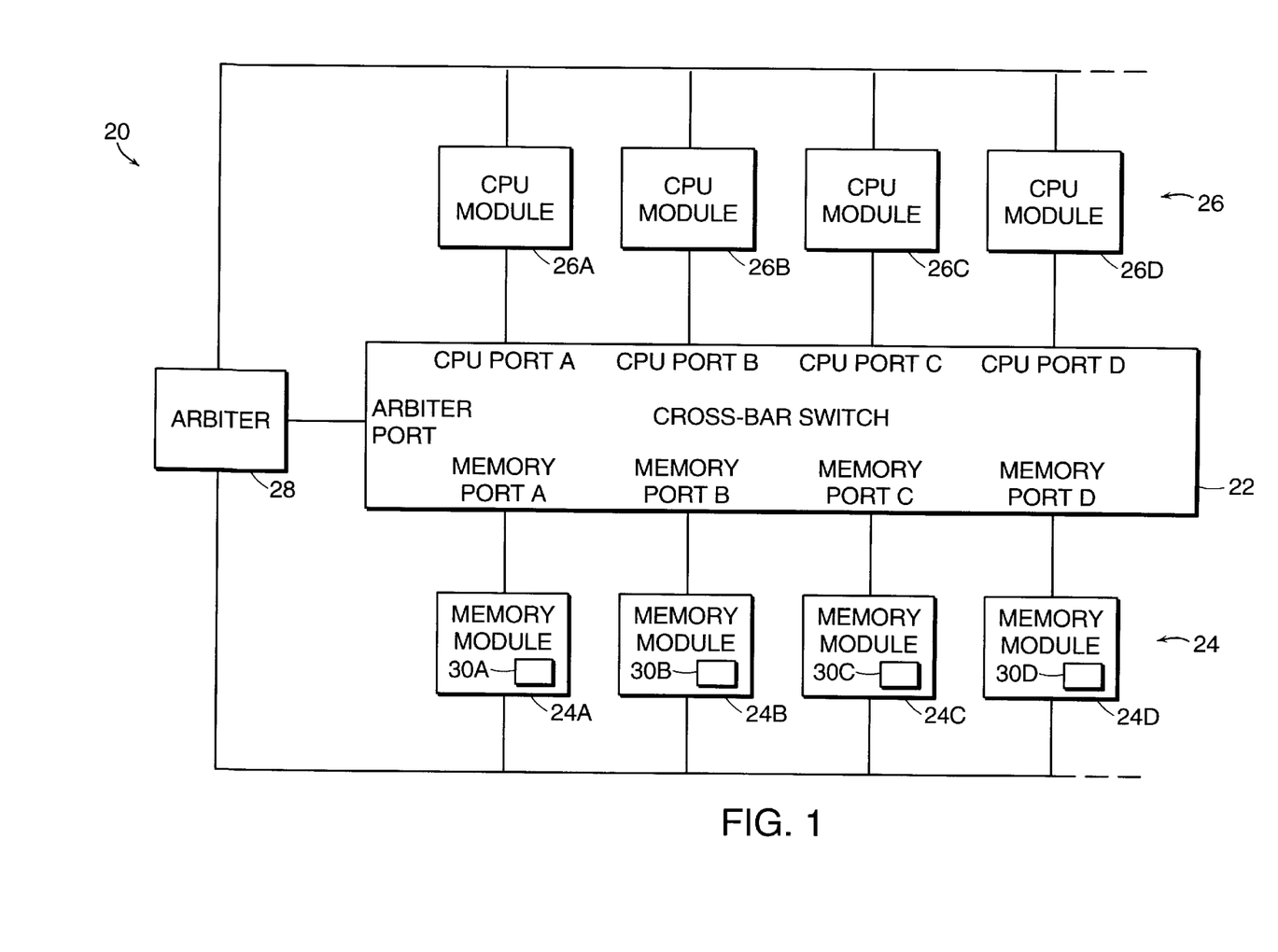
FIG. 1 is a block diagram of a computer system having a memory system that includes multiple memory modules.

Reference is made to the drawings wherein the same reference numbers are used throughout multiple figures to designate the same or similar components. FIG. 1 shows a general layout of a computer system 20 that is suitable for the preferred embodiment of the invention. The computer system 20 includes a cross-bar switch 22, multiple memory modules 24, multiple CPU modules (processors) 26, and an arbiter 28. The cross-bar switch 22 includes memory ports that respectively connect to the memory modules 24, CPU ports that respectively connect to the processors 26, and an arbiter port that connects to the arbiter 28. Other devices may connect to the computer system 20 such as input/output devices and network interface devices.

The arbiter 28 configures the cross-bar switch 22 according to the needs of the processors 26. In particular, the arbiter 28 controls pathways between the memory and CPU ports of the cross-bar switch 22 such that multiple processors 26 and memory modules 24 can communicate simultaneously. The arbiter 28 can distinguish the memory modules 24 from each other according to module identifiers (module IDs) 30 that uniquely identify each memory module 24. Preferably, the module IDs 30 are sent to the memory modules 24 through circuits (e.g., module ID plugs, not shown) respectively associated with each memory port of the cross-bar switch 22. Alternatively, the module IDs are programmed into non-volatile memory locations within the memory modules 24.

Each memory module 24 includes individual semiconductor storage devices. Preferably, the memory modules 24 include synchronous dynamic random access memory devices (SDRAMs) such as Samsung's KM48S8030/KM48S8031 8M×8-bit device, or Mitsubishi Electric's M5M4S16S31CTP 2-bank×1MW×8-bit device. When such SDRAMs are used, the arbiter 28 can provide refresh signals to the memory modules 24 at particular times to coordinate refresh operations among the SDRAMs.

Figure 2:
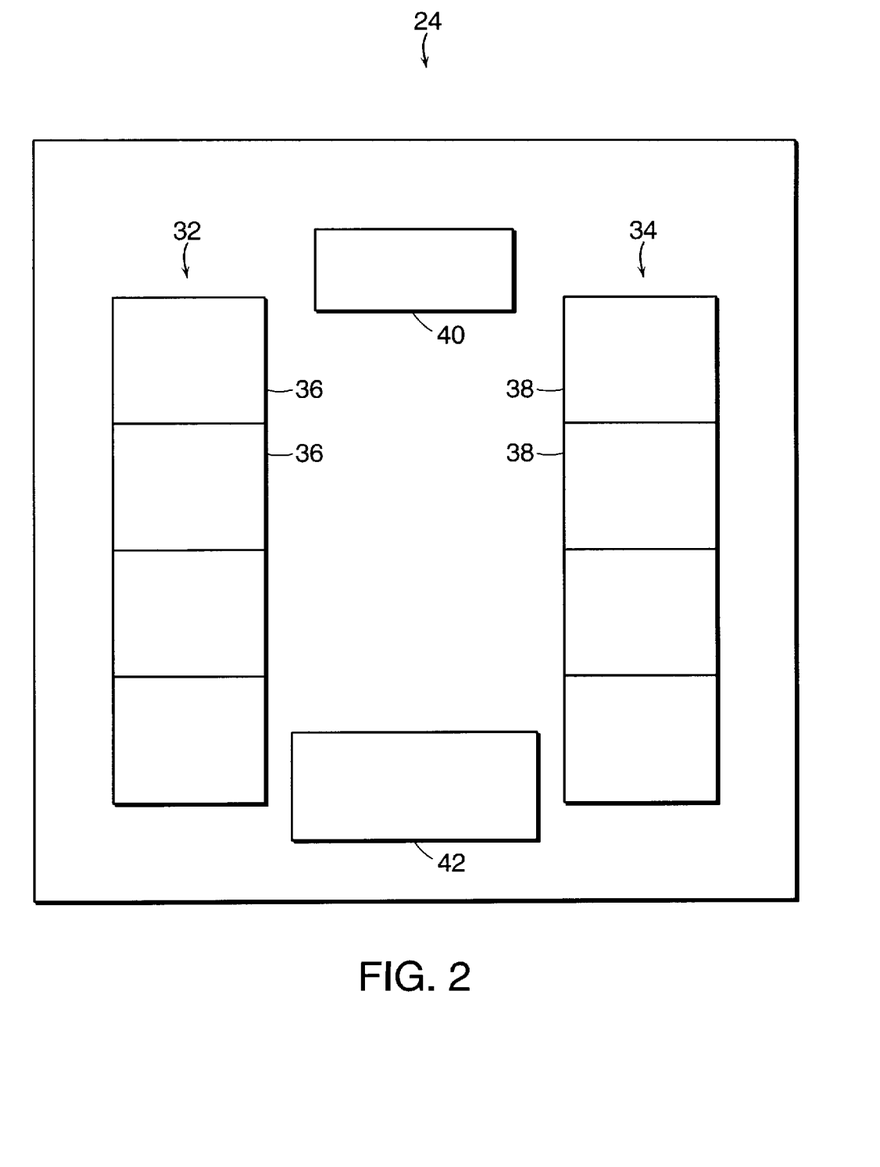
FIG. 2 is a block diagram of a memory module of FIG. 1 that includes multiple arrays, each array having multiple ranks.

As shown in FIG. 2, the semiconductor storage devices within each memory module 24 form multiple memory arrays 32,34 having multiple ranks 36,38. In particular, each memory module 24 includes a memory array 32 having four memory ranks 36, and a memory array 34 having another four memory ranks 38. Each memory module 24 further includes a data link 40 that transfers data between the memory arrays 32,34 and the cross-bar switch 22, and a memory controller 42 that controls addressing of particular locations within the memory ranks 36,38 of the memory arrays 32,34.

Each memory module 24 performs self test transactions until each memory rank 36,38 of each array 32,34 of that memory module 24 is tested completely. A complete test of a rank includes multiple test passes (i.e., multiple sets of self test transactions). In particular, for a memory module 24 to test one of its ranks, the memory module 24 writes a pattern to the rank, reads the pattern from the rank, writes an opposite pattern to the rank, reads the opposite pattern from the rank, and initializes the rank to particular values for normal operation. The self test transactions may also include additional read and write transactions such that both error correction codes and opposite error correction codes are tested.

Figure 3:
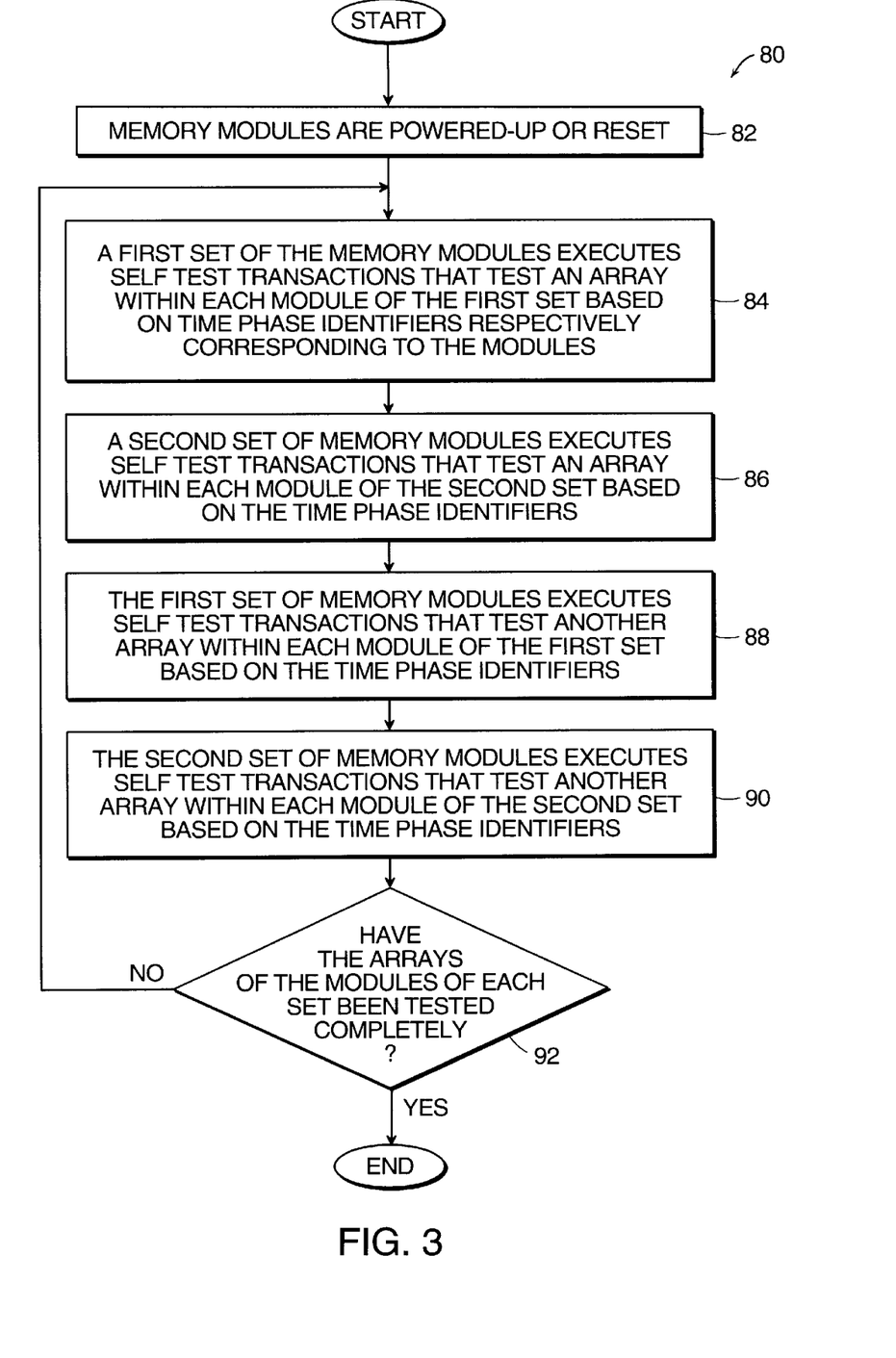
FIG. 3 is a flow chart of a method performed by the memory modules of FIG. 1.

FIG. 3 shows a method 80 that is performed by the memory modules 24 of the computer system 20. When the memory modules 24 perform the method 80, the memory modules 24 execute self test transactions in different time phases based on time phase identifiers (time phase IDs) that respectively correspond to the memory modules 24. In step 82, the memory modules 24 are powered-up or reset. In step 84 (during a first time phase), a first set of the memory modules 24 executes self test transactions that test locations within an array (e.g., array 32) of each module of the first set based on the time phase IDs. In step 86 (during a second time phase), a second set of the memory modules 24 executes self test transactions that test locations within an array (e.g., array 32) of each module of the second set based on the time phase IDs. In step 88 (during the first time phase), the first set of the memory modules 24 executes self test transactions that test locations within another array (e.g., array 34) of each module of the first set based on the time phase IDs. In step 90 (during the second time phase), the second set of the memory modules 24 executes self test transactions that test locations within another array (e.g., array 34) of each module of the second set based on the time phase IDs. If the arrays of the modules have not been tested completely (i.e., if untested locations exist), step 92 loops back to steps 84, 86, 88 and 90 in order to test the remaining untested locations. However, if the arrays have been tested completely, the method 80 ends.

The interleaving of self test transactions between sets of memory modules 24 (e.g., steps 84 and 86) and the alternating between arrays (e.g., steps 84 and 88) provides the arrays with opportunities to recover from testing (e.g., to precharge) while other arrays undergo testing. For example, an array that is tested in during step 84 can recover during steps 86, 88 and 90 while other arrays are being tested.

The memory modules 24 preferably initiate steps 84, 86, 88 and 90 of the method 80 at a rate that is half that of a normal operating clock rate used by the memory modules 24 during a normal operating mode. Initiating self test transactions at such a reduced clock rate, and executing self test transactions at different time phases within the memory modules lowers both the instantaneous power and the average power consumed by the memory modules. Accordingly, power supply limitations are not exceeded.

Furthermore, since execution of self test transactions is based on time phase IDs that correspond to the memory modules 24, it should be understood that such execution is independent of a central controller (e.g., one of the processors 26). That is, the memory modules 24 can operate without knowledge of each other or any central controller to execute self test transactions in an interleaved manner using the time phase IDs.

Preferably, the time phase IDs are bit fields of the module IDs that uniquely identify the memory modules 24. For example, the memory modules 24A, 24B, 24C and 24D (see FIG. 1) can be uniquely identified by the module IDs 00, 01, 10 and 11. The time phase IDs for the memory modules 24 can be, for example, the most significant bits of the module IDs. As such, the time phase IDs for the memory modules 24A, 24B, 24C and 24D are 0, 0, 1 and 1, respectively. The memory modules 24A and 24B have 0 as a time phase ID, and form a set of memory modules that execute self test transactions during one time phase. Similarly, the memory modules 24C and 24D have 1 as a time phase ID, and form a set of memory modules that execute self test transactions during a different time phase.

Alternatively, the time phase IDs can be the least significant bits of the modules IDs. In this alternative situation, the time phase IDs for the memory modules 24A, 24B, 24C and 24D are 0, 1, 0 and 1, respectively. Hence, the memory modules 24A and 24C form a set of memory modules that execute self test transactions during one time phase, and the memory modules 24C and 24D form a set of memory modules that execute self test transactions during a different time phase.

Figure 4:
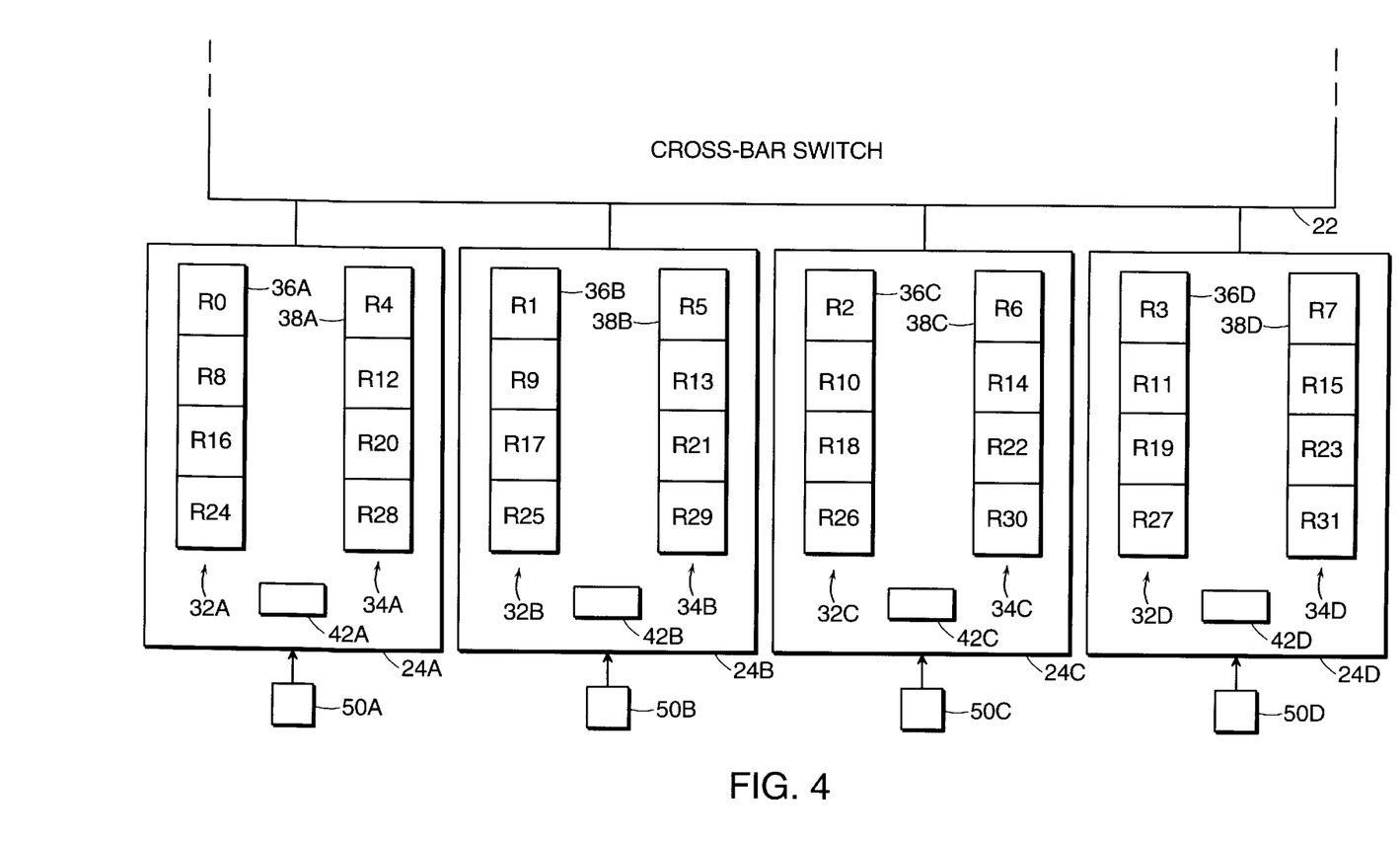
FIG. 4 is a block diagram of a portion of the computer system of FIG. 1 illustrating an interleaving order of the multiple ranks of the memory modules.

FIG. 4 shows the 32 ranks for the four memory modules 24 of the computer system 20. The four memory modules 24A, 24B, 24C and 24D obtain respective time phase IDs 50A, 50B, SOC and 50D. The 32 ranks are ordered from R0 through R31 to indicate the order in which they are tested when the memory modules 24A, 24B, 24C and 24D have time phase IDs 0, 0, 1 and 1, respectively, (e.g., when the time phase IDs are the most significant bits of respective module IDs 00, 01, 10 and 11). Memory modules 24A and 24B form one set of modules since each has a time phase ID of 0, and memory modules 24C and 24D form another set of memory modules since each has a time phase ID of 1. As the memory modules 24 perform the method 80 (see FIG. 3), the memory modules 24 execute self test transactions in an interleaved manner across the four modules. In particular, locations in ranks R0 and R1 are tested during a first time phase (during step 84), locations in ranks R2 and R3 are tested during a second time phase (during step 86), locations in ranks R4 and R5 are tested during the first time phase (during step 88), and locations in ranks R6 and R7 are tested during the second time phase (during step 90), and so on. Steps 84 through 90 are repeated until each of the ranks R0 and R31 have been tested completely.

Figure 5:
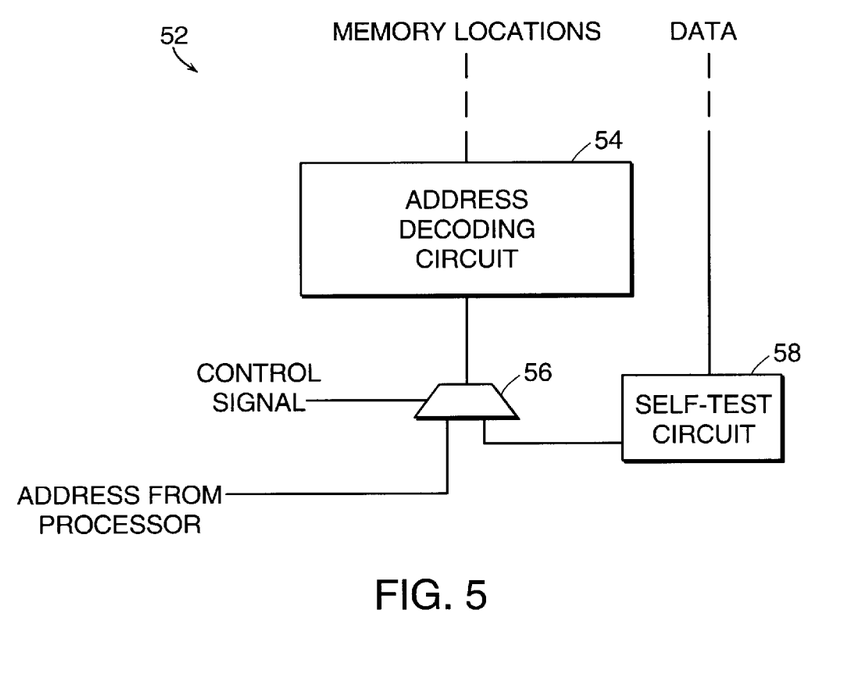
FIG. 5 is a block diagram of addressing circuits within a memory controller of a memory module of FIG. 1.

FIG. 5 shows a portion 52 of the memory controller 42 of a memory module 24 that accesses the locations within the ranks 36,38 of the arrays 32,34 during self test. The portion 52 includes an address decoding circuit 54, a multiplexer 56, and a self test circuit 58. The multiplexer 56 selects either an address from one of the processors 26 or an address from the self test circuit 54 based on a control signal. When the memory module 24 is powered-up or reset, the control signal sets the multiplexer 56 to provide addresses from the self test circuit 58 to the address decoding circuit 54. The self test circuit 58 writes data to or receives data from memory locations accessed by the address decoding circuit 54. As a result, the address decoding circuit 54 accesses addresses within the arrays 32,34 that are selected by the self test circuit. When the memory module 24 has completed self test, the memory module enters a normal operation mode and the control signal sets the multiplexer to provide addresses from the processors 26. Accordingly, the memory controller can then access ranks within the arrays 32,34 that are selected by the processors 26.

Figure 6:
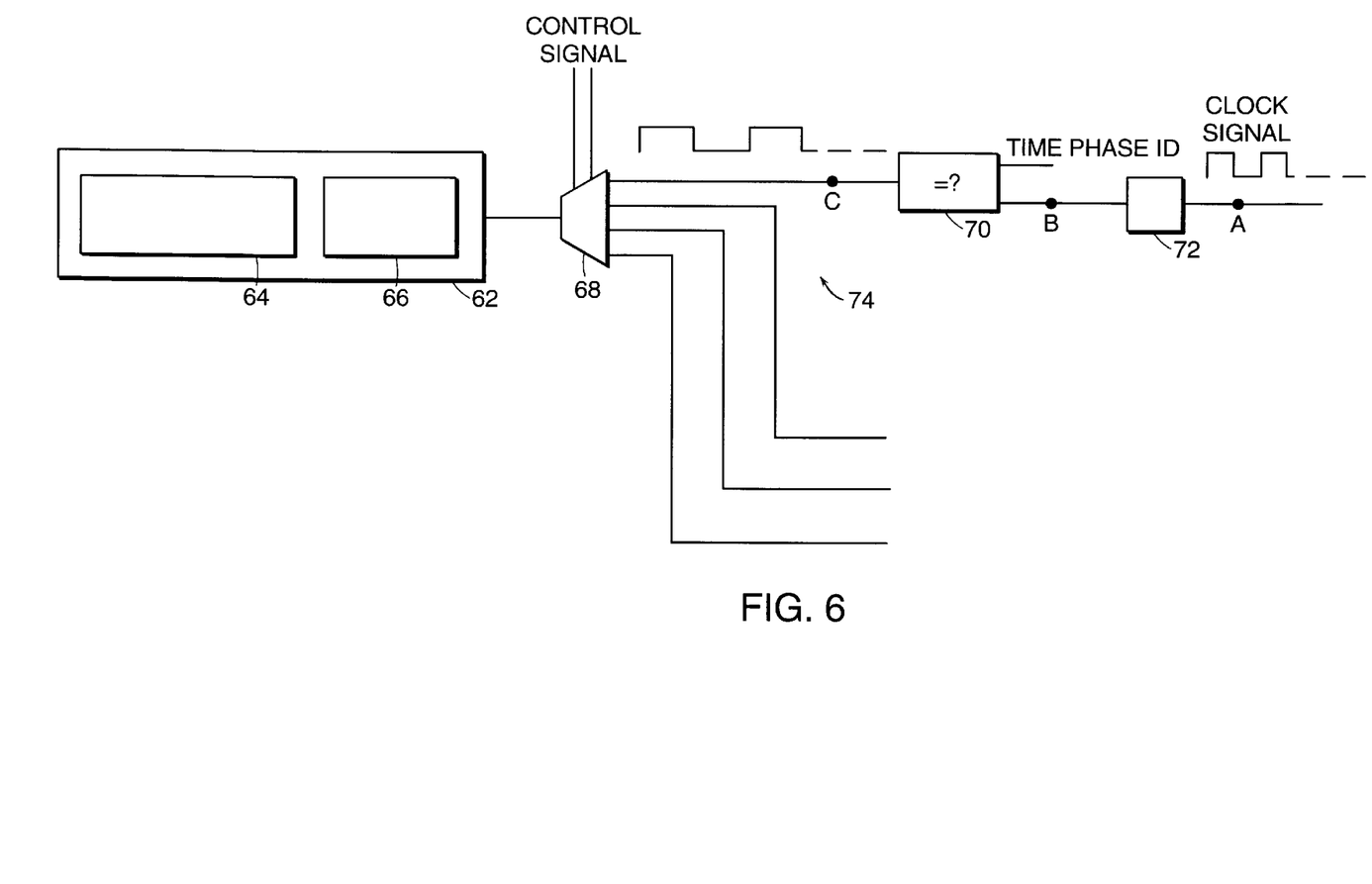
FIG. 6 is a block diagram of a portion of a self test circuit of FIG. 5.

FIG. 6 shows a portion 60 of the self test circuit 58 that provides addresses within the arrays 32,34 of the memory module 24 to be tested. The portion 60 includes an address generator 62, a multiplexer 68, a comparator 70 and a toggle circuit 72. The address generator 62 includes a first counter 64 and a second counter 66 that provide addresses within the ranks 36,38 of the arrays 32,34 of the memory module 24. In particular, the first counter 64 is preferably a linear feedback shift register that cycles through each address within a rank in a pseudo random order. The second counter 66 is preferably a standard 3-bit counter. The least significant bit of the second counter 66 identifies one of the two arrays 32,34, and the two most significant bits identify one of the four ranks 36,38 within the identified array. Accordingly, the array identified for testing alternates as the counter 66 updates (e.g., increments).

The address generator 62 is driven by a signal that is selected by the multiplexer 68. In particular, a control signal chooses one of the input lines 74 to the multiplexer 68. Preferably the multiplexer 68 receives the control signal from a control status register (CSR) within the memory controller 42.

When the multiplexers 68 of the memory modules 24 select the outputs of the comparators 70 within their self test circuits 58, the memory modules 24 are configured to perform the method 80. That is, the memory modules 24 are configured to execute self test transactions in different time phases based on time phase IDs, as will be explained in more detail below and with reference to FIG. 7.

Figure 7:
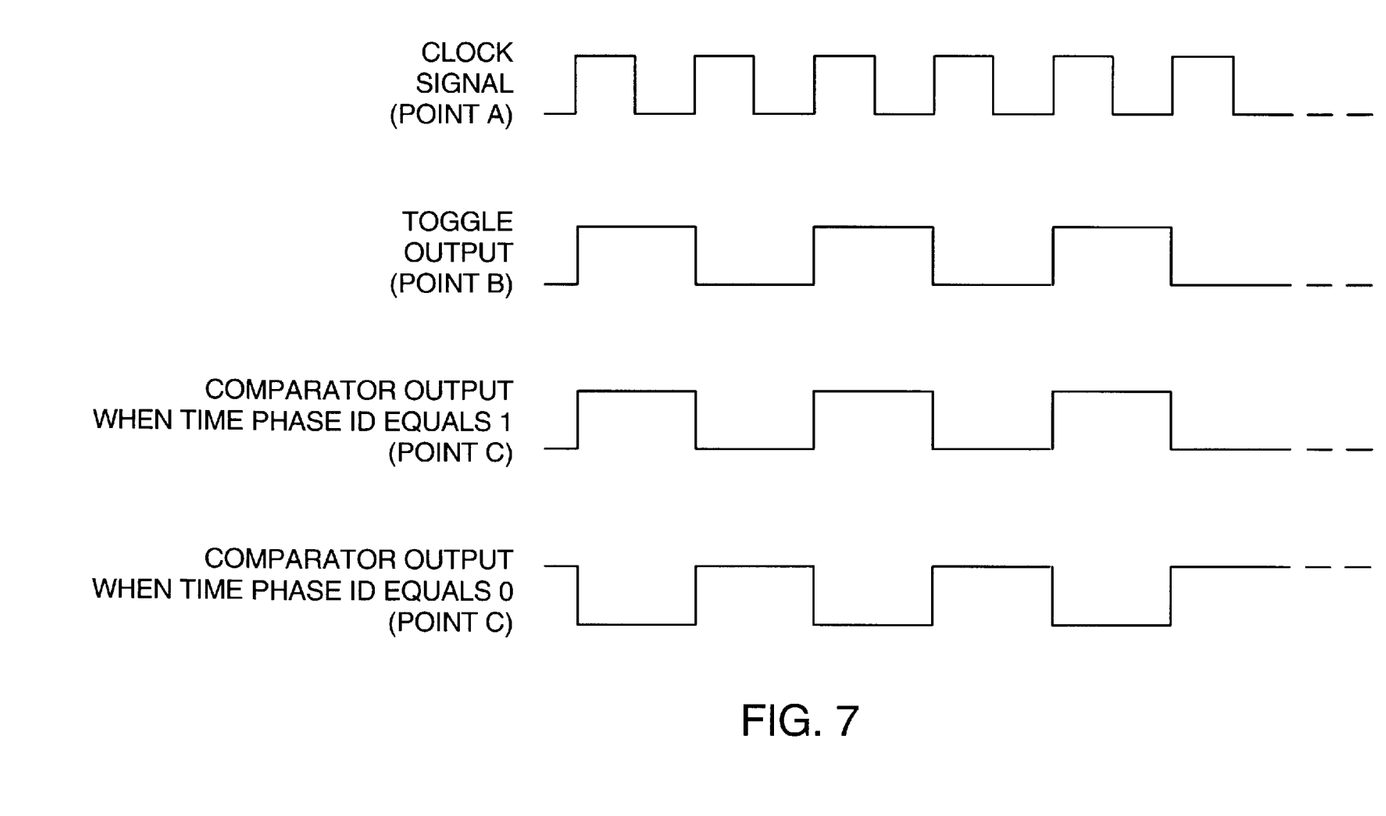
FIG. 7 is a timing diagram of signals used by the portion of the self test circuit of FIG. 6.

During a normal operating mode, the memory modules 24 operate at a normal operating rate. The toggle circuit 72 receives on its input (Point A) a clock signal having this normal operating clock rate, and provides on its output (Point B) a reduced clock signal that changes state on each positive edge of the clock signal. This reduced clock signal has half the normal operating clock rate. The comparator 70 compares the reduced clock signal to the time phase ID of the memory module 24, and provides on its output (Point C) a result of the comparison. Accordingly, as shown in FIG. 7, if the time phase ID is 1, the signal that drives the address generator 62 is the same as the reduced clock signal. In contrast, if the time phase ID is 0, the signal that drives the address generator 62 is opposite the reduced clock signal. As a result, the memory modules 24 with a time phase ID of 0 execute self test transactions during one phase, and memory modules 24 with a time phase ID of 1 execute self test transactions during a different phase. There is never a time phase in which every memory module 24 performs a self test transaction. Rather, some but not all of the memory modules 24 execute self test transactions simultaneously such that power restrictions of the computer system 20 are not exceeded.

It should be understood that there is no need for a central controller to initiate the memory module self tests. Rather, the memory module self tests can be performed before the processors 26 complete their self tests. Moreover, the memory modules 24 perform self tests at an internal memory module bandwidth which is generally equal to or higher than that of a processor interconnect (e.g., the crossbar switch 22 between the processors 26 and the memory modules 24). Accordingly, startup time can be minimized.

EQUIVALENTS

While this invention has been particularly shown and described with references to preferred embodiments thereof, it will be understood by those skilled in the art that various changes in form and details may be made therein without departing from the spirit and scope of the invention as defined by the appended claims.

For example, computer configurations other than that shown in FIG. 1 are suitable for the invention. In particular, computer system may include a single processor, or may include multiple processors that connect to the memory modules through a single interconnect rather than through a cross-bar switch.

Furthermore, the multiplexer 68 can be configured to select other oscillating signals such as a clock signal having the normal operating clock rate if there are no power supply constraints. Also, a circuit having two toggle circuits in series could be connected to the multiplexer 68 to accommodate time phase IDs having two bits (multiple bits) and to provide a clock signal having one fourth the normal operating clock rate.

Additionally, the counter 64 does not need to be a linear feedback shift register. Alternatively, the counter 64 can be a standard counter such that the address generator 62 generates addresses in sequence rather than in a pseudo random manner.

Furthermore, the invention technique can be applied to devices other than memory modules. In particular, other modules that should not execute self tests simultaneously (e.g., due to power consumption constraints) can be controlled such that self test execution is interleaved as described above.

What is claimed is:

1. A method for self testing a memory system having memory modules, the method comprising the steps of:

obtaining time phase identifiers that respectively correspond to the memory modules; and executing, in the memory modules, self test transactions in different time phases depending on the obtained time phase identifiers.

2. The method of claim 1, wherein the memory modules operate at a normal operating clock rate during a normal operating mode, and wherein the step of executing includes the step of:

reducing the normal operating clock rate to a reduced clock rate such that the memory modules initiate execution of self test transactions at the reduced clock rate.

3. The method of claim 1, wherein the step of obtaining includes the step of:

acquiring the time phase identifiers independently of a central controller that is capable of accessing each of the memory modules during a normal operating mode.

4. The method of claim 1, wherein the time phase identifiers are based on module identifiers that uniquely identify the memory modules.

5. The method of claim 4, wherein each time phase identifier includes a bit field of the module identifier that uniquely identifies the time phase to which that memory module corresponds, and wherein the step of executing includes, for each memory module, the steps of:

comparing the bit field of the module identifier that uniquely identifies that time phase to a signal; and initiating a self test transaction in that memory module when the bit field matches the signal.

6. The method of claim 1, wherein the step of executing includes the step of:

executing self test transactions in multiple memory modules in each of the different time phases.

7. The method of claim 6, wherein the memory system includes four memory modules, and wherein the step of executing the self test transactions in the multiple memory modules includes the step of:

executing self test transactions in two of the four memory modules in each of the different time phases.

8. The method of claim 1, wherein each memory module includes multiple arrays, and wherein the step of executing includes, the step of:

executing, in each memory module, self test transactions that alternately access the multiple arrays of that memory module.

9. The method of claim 1, wherein the step of executing includes the step of:

initiating self test transactions in the memory modules before completing a self test of a central controller that is capable of accessing each of the memory modules during a normal operating mode.

10. A memory system, comprising:

memory modules; and time phase identification circuitry, coupled to the memory modules, that provides time phase identifiers that respectively correspond to the memory modules, the memory modules executing self test transactions in different time phases depending on the time phase identifiers.

11. The system of claim 10, wherein the memory modules operate at a normal operating clock rate during a normal operating mode, and wherein each memory module includes:

a clock rate reducing circuit that reduces the normal operating clock rate to a reduced clock rate such that the memory modules initiate execution of self test transactions at the reduced clock rate.

12. The system of claim 10, wherein the memory modules include self test circuits, coupled to the time phase identifier circuitry, that acquire the time phase identifiers independently of a central controller that is capable of accessing each of the memory modules during a normal operating mode.

13. The system of claim 10, wherein the time phase identifiers are based on module identifiers that uniquely identify the memory modules.

14. The system of claim 13, wherein each time phase identifier includes a bit field of the module identifier that uniquely identifies the time phase to which that memory module corresponds, and wherein each memory module includes:

a self test circuit, coupled to the time phase identifier circuitry, that compares the bit field of the module identifier that uniquely identifies that time phase to a signal, and initiates a self test transaction in that memory module when the bit field matches the signal.

15. The system of claim 10, wherein the time phase identifier circuitry provides the time phase identifiers such that multiple memory modules execute self test transactions in each of the different time phases.

16. The system of claim 15, wherein the multiple memory modules include four memory modules, and wherein the time phase identifier circuitry provides the time phase identifiers such that two of the four memory modules execute self test transactions in each of the different time phases.

17. The system of claim 10, wherein each memory module includes:

multiple arrays; and a self test circuit, coupled to the multiple arrays, that executes self test transactions that alternately access the multiple arrays.

18. The system of claim 10, wherein the memory modules respectively include self test circuits that initiate self test transactions in the memory modules before a central controller completes a self test, the central controller being capable of accessing each of the memory modules during a normal operating mode.

19. A method for self testing a memory system having memory modules that operate at a normal operating clock rate during a normal operating mode, each memory module having multiple arrays of synchronous dynamic random access memory devices, the method comprising the steps of:

obtaining, independently of a central controller, time phase identifiers that respectively correspond to the memory modules;

reducing the normal operating clock rate to a reduced clock rate; and executing, in the memory modules, self test transactions in different time phases depending on the obtained time phase identifiers, wherein the memory modules initiate execution of self test transactions at the reduced clock rate, and wherein multiple memory modules execute self test transactions in each of the different time phases, each memory module executing self test transactions that alternately access the multiple arrays of that memory module.

20. The method of claim 19, wherein the time phase identifiers are based on module identifiers that uniquely identify the memory modules.

* * * * *